(12) United States Patent
Zhou

(10) Patent No.: US 11,527,586 B2
(45) Date of Patent: Dec. 13, 2022

(54) DISPLAY DEVICE, METHOD FOR CONTROLLING THE SAME, AND DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventor: Weilong Zhou, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 165 days.

(21) Appl. No.: 16/811,411

(22) Filed: Mar. 6, 2020

(65) Prior Publication Data

US 2021/0151523 A1    May 20, 2021

(30) Foreign Application Priority Data

Nov. 20, 2019   (CN) .......................... 201911151722.6

(51) Int. Cl.
*H01L 27/00*   (2006.01)
*H01L 27/32*   (2006.01)
(Continued)

(52) U.S. Cl.
CPC ........ *H01L 27/3232* (2013.01); *G02F 1/1368* (2013.01); *G02F 1/136227* (2013.01);
(Continued)

(58) Field of Classification Search
None
See application file for complete search history.

(56) References Cited

U.S. PATENT DOCUMENTS 6,349,221 B1 *   2/2002   Wolf .......................... G09F 9/35
                                                       455/574
9,711,571 B2    7/2017   Kwon et al.
(Continued)

FOREIGN PATENT DOCUMENTS

CN        105960717 A    9/2016
CN        107644895 A    1/2018
(Continued)

OTHER PUBLICATIONS

Office Action, including search report, for Chinese Patent Application No. 201911151722.6, dated Aug. 11, 2021, 28 pages.

*Primary Examiner* — Reema Patel
(74) *Attorney, Agent, or Firm* — Westman, Champlin & Koehler, P.A.

(57) ABSTRACT

A display device, a method for controlling the same, and a display panel are provided, the display device includes: a transparent substrate; a plurality of electroluminescent devices arranged in an array on the substrate, a device with variable transmittance located between the electroluminescent devices and the substrate, the device with variable transmittance is configured so that a transmittance of the device with variable transmittance is switchable between a first transmittance and a second transmittance, and the first transmittance is greater than the second transmittance; and an image acquisition device on a side of the substrate away from the electroluminescent devices, in a case where the transmittance of the device with variable transmittance is switched to the first transmittance, external light irradiating the display device can pass through the device with variable transmittance and be incident on the image acquisition device.

16 Claims, 5 Drawing Sheets

(51) Int. Cl.
  *G02F 1/1362* (2006.01)
  *G02F 1/1368* (2006.01)
  *G02F 1/155* (2006.01)
  *G02F 1/157* (2006.01)
  *G02F 1/163* (2006.01)
  *H01L 51/00* (2006.01)
  *H01L 27/12* (2006.01)

(52) U.S. Cl.
  CPC .............. *G02F 1/155* (2013.01); *G02F 1/157* (2013.01); *G02F 1/163* (2013.01); *H01L 27/3216* (2013.01); *H01L 27/3234* (2013.01); *H01L 27/3258* (2013.01); *H01L 51/0096* (2013.01); *G02F 2201/44* (2013.01); *H01L 27/1248* (2013.01)

(56) References Cited

U.S. PATENT DOCUMENTS

| | | | |
|---|---|---|---|
| 10,686,154 B2 | 6/2020 | Kim et al. | |
| 10,811,473 B2 | 10/2020 | Guo | |
| 10,909,900 B2 | 2/2021 | Luan et al. | |
| 2014/0307303 A1* | 10/2014 | Lin | G02F 1/13338 359/266 |
| 2016/0027859 A1* | 1/2016 | Kim | H01L 27/3267 257/88 |
| 2016/0225832 A1 | 8/2016 | Kwon et al. | |
| 2018/0219171 A1 | 8/2018 | Kim et al. | |
| 2019/0058018 A1 | 2/2019 | Guo | |
| 2020/0168144 A1 | 5/2020 | Luan et al. | |

FOREIGN PATENT DOCUMENTS

| | | | | |
|---|---|---|---|---|
| CN | 108376693 A | | 8/2018 | |
| CN | 108878665 A | | 11/2018 | |
| CN | 108987451 A | | 12/2018 | |
| CN | 109300968 A | | 2/2019 | |
| CN | 110190097 | * | 8/2019 | ............ H01L 27/32 |
| CN | 110190097 A | | 8/2019 | |

* cited by examiner

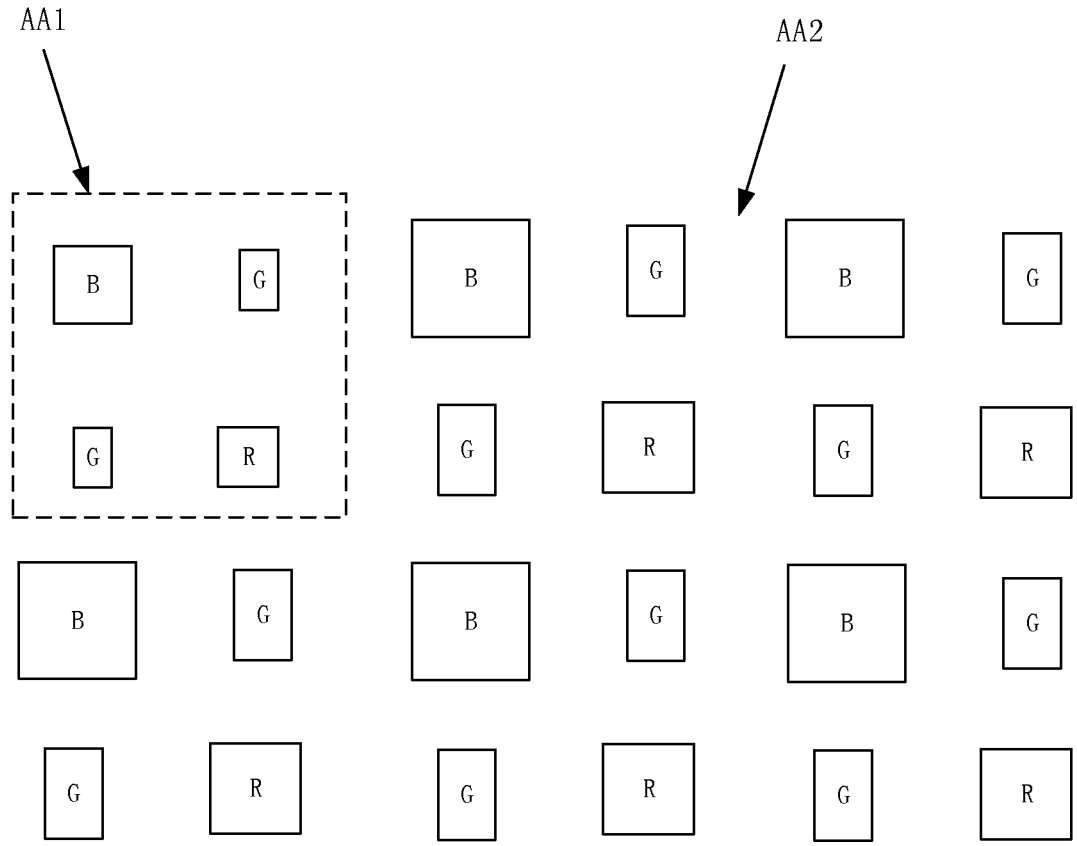

FIG. 8

| controlling the first display area to be in a non-display state and switching the device with variable transmittance to a first transmittance in response to the image acquisition device being in an operating state | S10 |

↓

| controlling the first display area to be in a display state and switching the device with variable transmittance to a second transmittance in response to the image acquisition device being in a non-operating state | S20 |

FIG. 9

DISPLAY DEVICE, METHOD FOR CONTROLLING THE SAME, AND DISPLAY PANEL

CROSS-REFERENCE TO RELATED APPLICATION

The present disclosure claims the benefit of Chinese Patent Application No. 201911151722.6 filed on Nov. 20, 2019 in the National Intellectual Property Administration of China, the whole disclosure of which is incorporated herein by reference.

TECHNICAL FIELD

The present disclosure relates to the field of display technology, and in particular to a display device, a method for controlling the same, and a display panel.

BACKGROUND

The electroluminescent display panel technology represented by OLED technology has made rapid progresses, and the display panel tends to have a higher screen ratio. For a portable mobile display terminal, such as a mobile phone, a front camera has become a barrier to pursuing a high screen ratio. Compromised designs such as grooves, openings, and elevating cameras have appeared in the prior art. The design of grooves or openings adversely affects the aesthetics, and may not achieve an ultra-high screen ratio. The design of elevating cameras requires additional mechanical structures and there is a risk of being damaged.

SUMMARY

Some embodiments of the present disclosure provide a display device, comprising: a transparent substrate; a plurality of electroluminescent devices arranged in an array on the substrate, the plurality of electroluminescent devices being located in a display area of the display device, the display area comprising a first display area and a second display area; a device with variable transmittance located at least in the first display area and located between the electroluminescent devices and the substrate, wherein the device with variable transmittance is configured so that a transmittance of the device with variable transmittance is switchable between a first transmittance and a second transmittance, the first transmittance is greater than the second transmittance; and an image acquisition device on a side of the substrate away from the electroluminescent devices, an orthographic projection of the image acquisition device on the substrate falling within an orthographic projection of the first display area on the substrate, wherein, in a case where the transmittance of the device with variable transmittance is switched to the first transmittance, external light irradiating the display device can pass through the device with variable transmittance and be incident on the image acquisition device.

In some embodiments, in a case where the transmittance of the device with variable transmittance is switched to the second transmittance, the device with variable transmittance blocks reflected light from being incident on the electroluminescent devices in the first display area, the reflected light comprising at least light reflected by the image acquisition device.

In some embodiments, the orthographic projection of the image acquisition device on the substrate falls within an orthographic projection of the device with variable transmittance on the substrate.

In some embodiments, an orthographic projection of the device with variable transmittance on the substrate falls within the orthographic projection of the first display area on the substrate.

In some embodiments, the device with variable transmittance is configured to switch the transmittance of the device with variable transmittance to the first transmittance in response to the image acquisition device being in an operating state; and to switch the device with variable transmittance to the second transmittance in response to the image acquisition device being in a non-operating state.

In some embodiments, the device with variable transmittance comprises an electrochromic device, the electrochromic device comprising a first transparent conductive layer, an ion storage layer, an ion conductor layer, an electrochromic layer, and a second transparent conductive layer which are sequentially stacked.

In some embodiments, the display device further comprising: a backplane circuit assembly between the device with variable transmittance and the substrate.

In some embodiments, each of the electroluminescent devices comprises a first electrode, an electroluminescent layer, and a second electrode which are sequentially disposed away from the substrate, the backplane circuit assembly comprises a driving transistor, and the first electrode is electrically connected to the driving transistor through a via hole penetrating the device with variable transmittance.

In some embodiments, the display device further comprising: a first planarization layer between the backplane circuit assembly and the device with variable transmittance; and/or a second planarization layer between the electroluminescent devices and the device with variable transmittance.

In some embodiments, the plurality of electroluminescent devices comprise a plurality of first electroluminescent devices located in the first display area and a plurality of second electroluminescent devices located in the second display area, and each of the plurality of first electroluminescent devices and the plurality of second electroluminescent devices comprises a first electrode, an electroluminescent layer and a second electrode which are sequentially disposed away from the substrate, a ratio of a total area of first electrodes of the plurality of first electroluminescent devices to an area of the first display area is smaller than a ratio of a total area of first electrodes of the plurality of second electroluminescent devices to an area of the second display area.

In some embodiments, second electrodes of the plurality of first electroluminescent devices are spaced apart from each other.

In some embodiments, second electrodes of the plurality of second electroluminescent devices constitute a continuous integrated structure.

In some embodiments, first electrodes of the plurality of first electroluminescent devices are made of a transparent conductive material.

In some embodiments, the first electrode is an anode and the second electrode is a cathode.

In some embodiments, the first transmittance is greater than or equal to 90%, and/or the second transmittance is less than or equal to 10%.

Some embodiments of the present disclosure provide a method for controlling a display device, the display device comprising: a transparent substrate; a plurality of electroluminescent devices arranged in an array on the substrate, the plurality of electroluminescent devices being located in a display area of the display device, the display area comprising a first display area and a second display area; a device with variable transmittance located at least in the first display area and located between the electroluminescent devices and the substrate, wherein the device with variable transmittance is configured so that a transmittance of the device with variable transmittance is switchable between a first transmittance and a second transmittance, the first transmittance is greater than the second transmittance; and an image acquisition device on a side of the substrate away from the electroluminescent devices, an orthographic projection of the image acquisition device on the substrate falling within an orthographic projection of the first display area on the substrate, wherein the method comprise: switching the device with variable transmittance to the first transmittance in response to the image acquisition device being in an operating state; and switching the device with variable transmittance to the second transmittance in response to the image acquisition device being in a non-operating state.

In some embodiments, the device with variable transmittance comprises an electrochromic device, the electrochromic device comprising a first transparent conductive layer, an ion storage layer, an ion conductor layer, an electrochromic layer, and a second transparent conductive layer which are sequentially stacked, switching the device with variable transmittance to the first transmittance comprises applying a first voltage between the first transparent electrode layer and the second transparent electrode layer, so that the electrochromic device is switched to the first transmittance, and switching the device with variable transmittance to the second transmittance comprises applying a second voltage, which is different from the first voltage, between the first transparent electrode layer and the second transparent electrode layer, so that the electrochromic device is switched to the second transmittance.

Some embodiments of the present disclosure provide a display panel, comprising: a transparent substrate; a plurality of electroluminescent devices arranged in an array on the substrate, the plurality of electroluminescent devices being located in a display area of the display panel, the display area comprising a first display area and a second display area; and a device with variable transmittance located at least in the first display area and located between the electroluminescent devices and the substrate, wherein the device with variable transmittance is configured so that a transmittance of the device with variable transmittance is switchable between a first transmittance and a second transmittance, the first transmittance is greater than the second transmittance, wherein, in a case where the transmittance of the device with variable transmittance is switched to the first transmittance, external light irradiating the display panel can pass through the device with variable transmittance.

BRIEF DESCRIPTION OF THE DRAWINGS

In order to more clearly describe the technical solutions of the embodiments of the present disclosure, the drawings of the embodiments will be briefly described below. It should be understood that the drawings described below only relate to some embodiments of the present disclosure, but are not construed as the limitation to the present disclosure, wherein:

FIG. 2 shows an optical path of external light incident on an image acquisition device when a device with variable transmittance is switched to a first transmittance;

FIG. 3 shows an optical path of external light entering the display device and then being reflected by a backplane circuit assembly when the device with variable transmittance is switched to the second transmittance;

FIG. 8 is a schematic view of a pixel arrangement of a display device according to some embodiments of the present disclosure; and FIG. 9 is a flowchart of a method for controlling a display device according to some embodiments of the present disclosure.

DETAILED DESCRIPTION OF THE EMBODIMENTS

Figure 1:
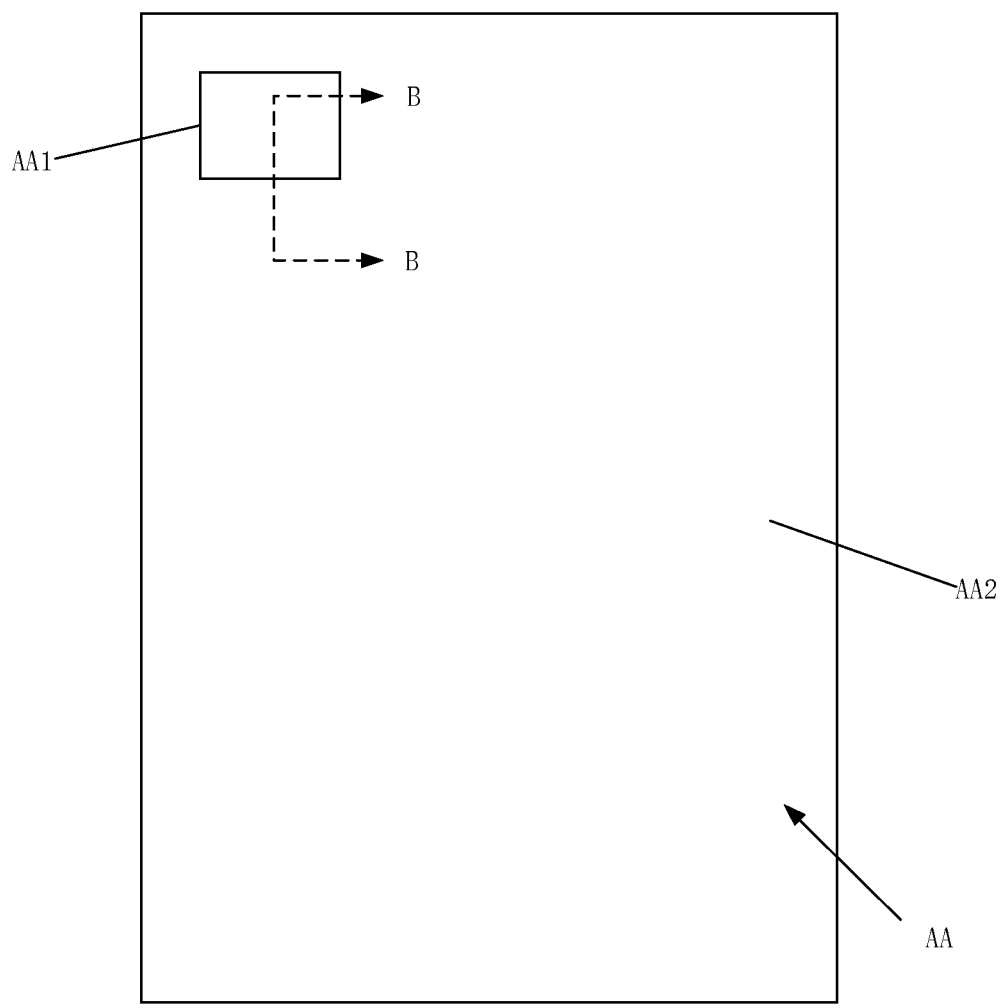
FIG. 1 is a plan view of a display device according to some embodiments of the present disclosure.

In order to more clearly illustrate purposes, technical solutions, and advantages of the present disclosure, the embodiments of the present disclosure will be described in detail below with reference to the accompanying drawings. It should be understood that the following description of the embodiments is intended to explain the general idea of the present disclosure, and should not be construed as limiting the present disclosure. In the description and the drawings, the same or similar reference numerals refer to the same or similar parts or components. For clarity, the drawings are not necessarily drawn to scale, and some well-known components and structures may be omitted from the drawings.

Unless otherwise defined, the technical or scientific terms used in the present disclosure shall have the ordinary meanings understood by those having ordinary skills in the field to which the present disclosure belongs. The terms "first", "second", and the like used in the disclosure do not indicate any order, quantity, or importance, but are only used to distinguish different components. The word "a" or "an" does not exclude multiple. The word such as "including/include" or "comprising/comprise" means that the elements or items appearing before the word covers the elements or items appearing after the word and the equivalent thereof without excluding other elements or items. The word such as "connected" or "connected" is not limited to physical or mechanical connections, but may include electrical connections, whether direct or indirect. The word "Up", "down", "left", "right", "top", or "bottom" is only used to indicate the relative position relationship. When the absolute positions of the described objects change, the relative position relationship may also change correspondingly. When an element such as a layer, film, region, or substrate is referred to as being on or under another element, the element can be directly on or under the other element, or there may be intermediate elements.

Unless otherwise stated, the expression "display area" herein refers to an area of a display panel or a display device for displaying information such as text, static images (such as pictures) or dynamic images (such as videos). The expression "transmittance" refers to the ability of light to pass through a medium, and is generally a ratio of the amount of light transmitted through the medium to the amount of light incident on the medium.

In the related technology, in order to achieve an ultra-high screen ratio, an under-screen camera technology can be adopted. There are many difficulties in the technology. For example, the under-screen camera requires a screen (i.e., a display panel) to have a good transmittance, however the pursuit of high transmittance requires a transparent cathode and anode. Light emitted by an electroluminescent device, such as an OLED device, may pass through the transparent anode and be transmitted to a backplane circuit assembly, then be reflected by the backplane circuit assembly, and then be emitted in the forward direction, or be by reflected by a colored film of a substrate (for example, the substrate may be a yellow flexible polyimide substrate), thereby adversely affecting the front display effect of the display device using the under-screen camera technology.

The present disclosure provides a display panel and a display device including the display panel. The display panel includes: a transparent substrate; and electroluminescent devices arranged in an array on the substrate, the electroluminescent devices being located in a display area of the display panel, the display area including a first display area and a second display area; and a device with variable transmittance located at least in the first display area and located between the electroluminescent devices and the substrate. The device with variable transmittance is configured so that a transmittance thereof is switchable between a first transmittance and a second transmittance, and the first transmittance is greater than the second transmittance.

The display device further includes an image acquisition device, the image acquisition device is located on a side of the substrate away from the electroluminescent device, and an orthographic projection of the image acquisition device on the substrate falls within an orthographic projection of the first display area on the substrate.

In the above display device, the image acquisition device, such as a camera, is provided on the side of the display panel facing away from the display surface. Therefore, there is no need to provide grooves or openings in an area of the display panel corresponding to the image acquisition device, and the area may be used for display when the image acquisition device is in a non-operating state. As a result, an ultra-high screen ratio may be achieved, so that users have a good experience.

In addition, in the display panel of the display device, the area corresponding to the image acquisition device (i.e., the first display area) is provided with a device with variable transmittance, and the device with variable transmittance may be switched to the first transmittance when the image acquisition device is in an operating state, so that as much external light as possible may pass through the display panel and be incident on the image acquisition device, thus, the image acquisition device may complete image acquisition better. The device with variable transmittance may also be switched to the second transmittance when the image acquisition device is in a non-operating state, so as to avoid external light or light emitted by the electroluminescent devices from passing through the device with variable transmittance and entering the backplane circuit assembly, the substrate and the image acquisition device, thereby as much as possible avoiding the reflection of light incident on the backplane circuit assembly, the substrate and the image acquisition device from affecting the normal display of the area of the display panel corresponding to the image acquisition device.

The specific structure and working principle of the display panel and the display device in the present disclosure are described below with reference to specific embodiments.

Figure 2:
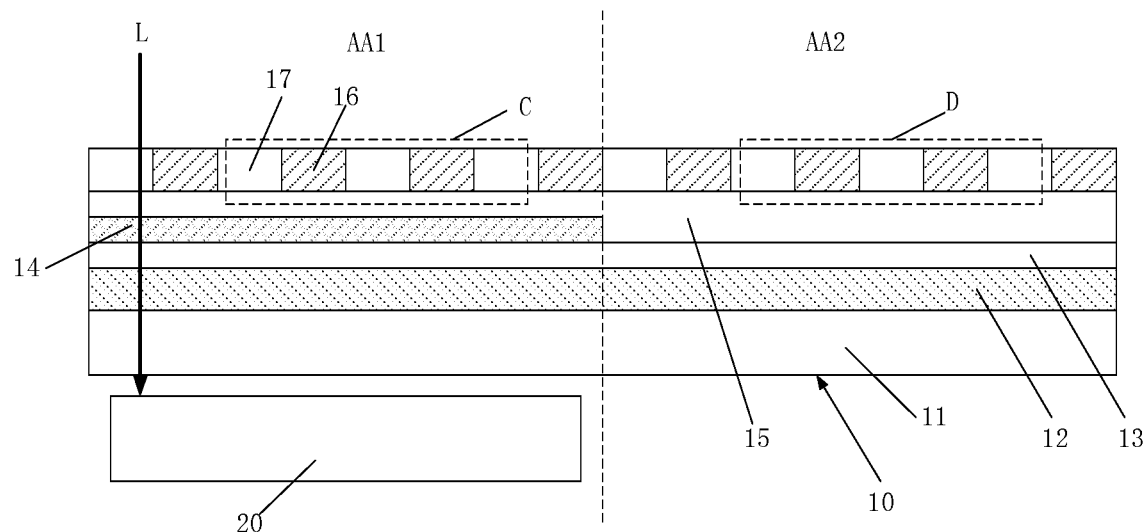
FIG. 2 is a schematic cross-sectional structure view of the display device in FIG. 1 taken along the line B-B.

FIG. 1 schematically illustrates a plan view of a display device according to some embodiments of the present disclosure. FIG. 2 is a schematic cross-sectional structure view of the display device in FIG. 1 taken along the line B-B. As shown in FIGS. 1 and 2, the display device 100 includes a display panel 10 and an image acquisition device 20 located on a side of the display panel 10 opposite to a light exit side thereof. The image acquisition device 20 is, for example, a camera, an image sensor, or the like.

The display panel 10 includes a transparent substrate 11 and a plurality of electroluminescent devices 16 arranged in an array on the substrate. The substrate 11 is, for example, a transparent flexible substrate, and may be made of a flexible transparent material such as polyimide or the like. The electroluminescent devices 16 are, for example, OLED (Organic Light-Emitting Diode) devices, PLED (Polymer Light-Emitting Diode) devices, or the like. Any two adjacent electroluminescent devices 16 are spaced apart from each other. A pixel defining layer 17 is disposed between any two adjacent electroluminescent devices 16. The pixel defining layer 17 is made of, for example, a transparent material.

The electroluminescent devices 16 are provided in a display area AA of the display panel 10. As shown in FIG. 1, the display area AA of the display panel 10 (which may also be understood as the display area AA of the display device 100) includes a first display area AA1 and a second display area AA2. The image acquisition device 20 is located in the first display area AA1, that is, an orthographic projection of the image acquisition device 20 on the substrate 11 falls within an orthographic projection of the first display area AA1 on the substrate 11. In the embodiments, the first display area AA1 covers the image acquisition device 20, and may be displayed normally when the image acquisition device 20 is in a non-operating state. As a result, an ultra-high screen ratio may be achieved, so that users have a good experience.

As shown in FIG. 2, the display panel 10 further includes a device with variable transmittance 14 disposed between the electroluminescent devices 16 and the substrate 11. The device with variable transmittance 14 is located in the first display area AA1. For example, in some embodiments, an orthographic projection of the device with variable transmittance 14 on the substrate 11 coincides with the orthographic projection of the first display area AA1 on the substrate 11, that is, the device with variable transmittance 14 occupies the entire first display area AA1. In other embodiments, the orthographic projection of the device with variable transmittance 14 on the substrate 11 may be located within the orthographic projection of the first display area AA1 on the substrate 11 on the substrate, and an area of the orthographic projection of the device with variable transmittance 14 on the substrate 11 is smaller than an area of the orthographic projection of the first display area AA1 on the substrate 11, that is, the device with variable transmittance 14 occupies a part of the first display area AA1. The device with variable transmittance 14 is configured such that a transmittance thereof may be switchable between a first transmittance and a second transmittance, wherein the first transmittance is greater than the second transmittance. The orthographic projection of the image acquisition device 20 on the substrate 11 falls within the orthographic projection of the device with variable transmittance 14 on the substrate 11.

FIG. 2 illustrates an optical path of the external light L incident on the image acquisition device 20 when the device with variable transmittance 14 is switched to the first transmittance. As shown in FIG. 2, the device with variable transmittance 14 is switched to the first transmittance. For example, the first transmittance may be 90% or more. The device with variable transmittance 14 is basically in a transparent state, so that as much external light L as possible is incident on the image capture device 20 through the first display area AA1 of the display panel 10, which facilitates the image acquisition device 20 to capture images.

Figure 3:
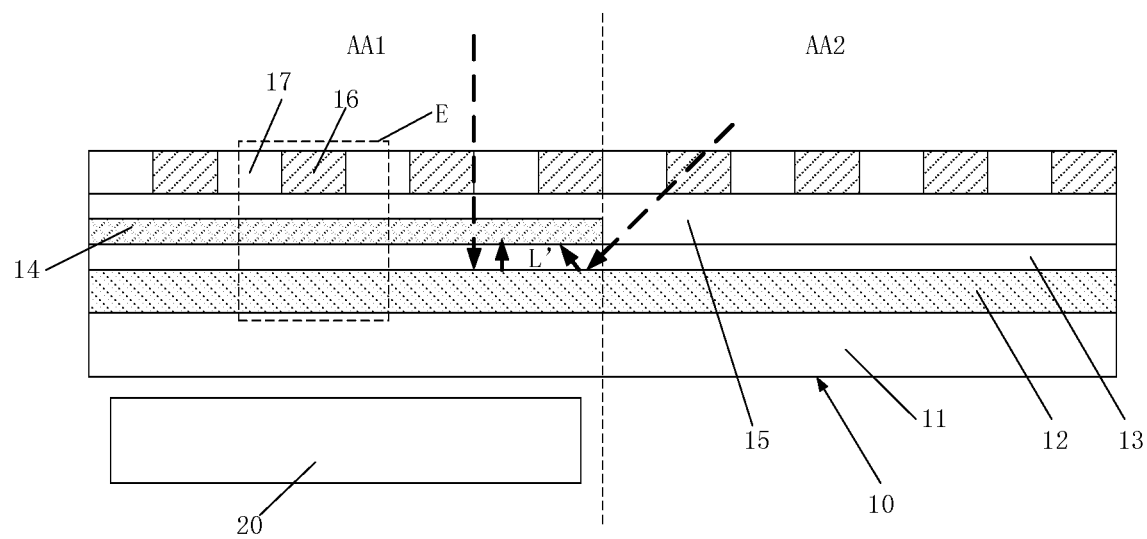
FIG. 3 is a schematic cross-sectional structure view of the display device in FIG. 1 taken along the line B-B.

FIG. 3 is a schematic cross-sectional structure view of the display device in FIG. 1 taken along line BB, and shows an optical path of external light when the device with variable transmittance is switched to the second transmittance, wherein the external light enters the display device and then is reflected by a backplane circuit assembly (which will be described in detail below). As shown in FIG. 3, the device with variable transmittance 14 is switched to the second transmittance. For example, the second transmittance may be 10% or less, and the device with variable transmittance 14 is basically in an opaque state. Although the device with variable transmittance 14 is basically in the opaque state, a small amount of light may still pass through the device with variable transmittance 14 and be incident on the backplane circuit assembly and the image acquisition device 20, due to the reflection effects of the backplane circuit assembly and the image acquisition device 20, part of the light is reflected toward the electroluminescent devices 16 located in the first display area AA1, as shown by light L' in FIG. 3. Moreover, due to the reflection effects of the backplane circuit assembly and even the image acquisition device 20, part of external light incident on an adjacent area is also reflected toward the electroluminescent devices 16 located in the first display area AA1, as shown by light L' in FIG. 3. In this case, since the device with variable transmittance 14 is basically in the opaque state, the device with variable transmittance 14 may block the reflected light L' from being incident on the electroluminescent devices 16 located in the first display area AA1, thereby avoiding affecting the normal display of the first display area AA1.

In some embodiments, the device with variable transmittance 14 may also cover the entire display area AA, that is, the orthographic projection of the device with variable transmittance 14 on the substrate 11 coincides with an orthographic projection of both the first display area AA1 and the second display area AA2 on the substrate 11. In this case, when the device with variable transmittance 14 is switched to the second transmittance, it may minimize the light reflected by components (e.g. the image acquisition device 20, the backplane circuit assembly and the like) located on the side of the transmittance variable device 14 away from the electroluminescent devices 16 toward the electroluminescent devices 16, thereby avoiding affecting the normal display of the whole display area AA.

As shown in FIGS. 2 and 3, the display panel 10 further includes a backplane circuit assembly 12, which is disposed between the device with variable transmittance 14 and the substrate 11. The backplane circuit assembly 12 is at least used to drive the electroluminescent devices 16 to emit light. For example, the backplane circuit assembly 12 may include a driving transistor T for driving the electroluminescence device 16 to emit light.

Figure 4:
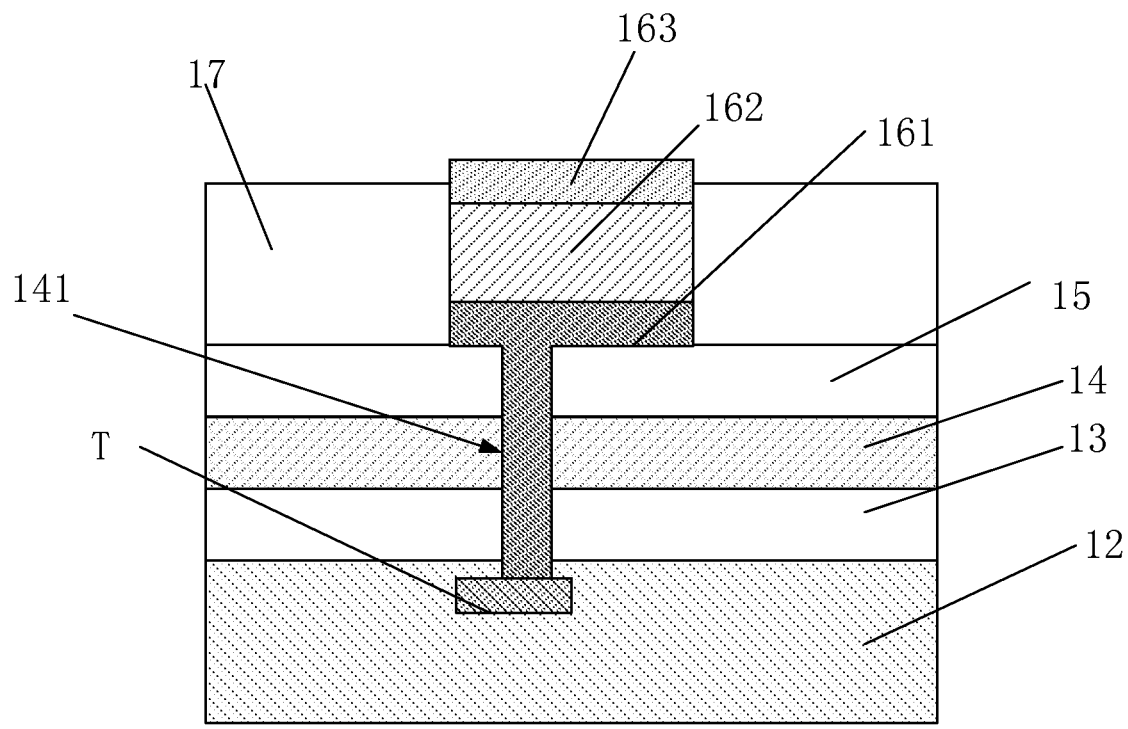
FIG. 4 is an enlarged schematic view of a region E in FIG. 3.

Specifically, FIG. 4 is an enlarged schematic view of a region E in FIG. 3. As shown in FIG. 4, each of the electroluminescent devices 16 includes a first electrode 161, an electroluminescent layer 162, and a second electrode 163 which are sequentially disposed away from the substrate 11. The first electrode 161 may be electrically connected to the driving transistor T through a via hole 141 penetrating the device with variable transmittance 14, for example, electrically connected to a source or a drain of the driving transistor T.

It should be understood that the backplane circuit assembly 12 generally includes opaque metal patterns, such as metal wirings, metal electrodes, and the like, and a portion between the metal patterns of the backplane circuit assembly 12 allows light to pass through. As shown in FIG. 3, the backplane circuit assembly 12 is disposed on a side of the device with variable transmittance 14 away from the electroluminescent devices 16. By switching the device with variable transmittance 14 to the second transmittance, the light reflected by the metal patterns in the backplane circuit assembly 12 toward the electroluminescent devices 16 may be minimized to avoid affecting the normal display of the display area AA, especially the first display area AA1.

As shown in FIGS. 2 and 3, the display panel 10 further includes a first planarization layer 13 provided between the backplane circuit assembly 12 and the device with variable transmittance 14, and a second planarization layer 15 provided between the electroluminescent devices 16 and the device with variable transmittance 14. The first planarization layer 13 and the second planarization layer 15 are both made of a transparent insulating material. In the first display area AA1, the first planarization layer 13 isolates the backplane circuit assembly 12 from the device with variable transmittance 14, and the second planarization layer 15 isolates the electroluminescent devices 16 from the transmittance, so as to ensure their normal operating characteristics and avoid defects such as short circuits.

In the display device 100 in the above embodiments, when the image acquisition device 20 is in the operating state, that is, when the display device 100 enable a view function, the first display area AA1 works in a non-display state, and the device with variable transmittance 14 is switched to the first transmittance, external light may pass through the pixel defining layer 17, the second planarization layer 15, the device with variable transmittance 14, and the first planarization layer 13, the backplane circuit assembly 12 and the substrate 11 among the electroluminescent devices 16 in the first display area AA1, and then be incident on the image acquisition device 20 to complete the image acquisition. In this case, since the first display area AA1 works in a non-display state, it may be avoided as much as possible that the electroluminescent devices 16 in the first display area AA1 emits light and affects light for image acquisition. Since the device with variable transmittance 14 is switched to the first transmittance, as much external light as possible passes through the first display area AA1 of the display panel 10 and reaches the image acquisition device 20 to obtain a better image acquisition effect. In addition, in the above case, the second display area AA2 of the display panel 10 may be normally displayed, for example, an image obtained by the image acquisition device 20 is displayed.

Figure 5:
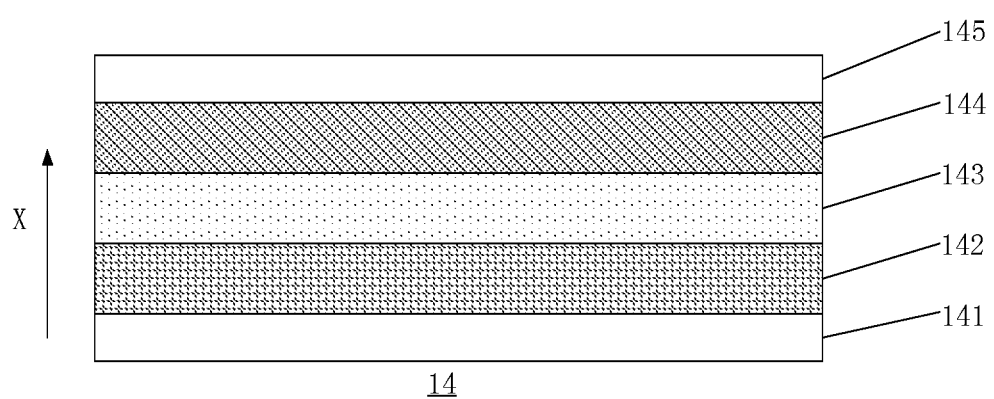
FIG. 5 is a schematic structural view of a device with variable transmittance according to some embodiments of the present disclosure.

FIG. 5 is a schematic structural view of a device with variable transmittance according to some embodiments of the present disclosure. In the embodiments of the present disclosure, the device with variable transmittance 14 is, for example, an electrochromic device. As shown in FIG. 5, the electrochromic device 14 includes a first transparent conductive layer 141, an ion storage layer 142, an ion conductor layer 143, an electrochromic layer 144, and a second transparent conductive layer 145 which are sequentially stacked. Specifically, the electrochromic layer 144 is a core layer of the electrochromic device 14 and can be switched between two states (i.e., a substantially transparent state and a substantially opaque state) based on ion implantation and extraction, for example, it may be made of NiOx material. The ion conductor layer 143 is used to provide an ion transmission channel between the electrochromic layer 144 and the ion storage layer 142. The ion storage layer 142 has a function of storing ions and balancing electric charges. The ion storage layer 142 and the ion conductor layer 143 are substantially in a transparent state. The first transparent conductive layer 141 and the second transparent conductive layer 145 are used to receive an external voltage, so that ions are injected into or extracted from the electrochromic layer 144 under the action of the external voltage, as a result, the electrochromic layer 144 may be switched between the substantially transparent state and the substantially opaque state.

Specifically, for example, the ions stored in the ion storage layer 142 are positive ions. When a positive voltage is applied between the first transparent conductive layer 141 and the second transparent conductive layer 145, the potential on the first transparent conductive layer 141 is higher than that on the second transparent conductive layer 145, that is, an electric field in the X direction is formed between the first transparent conductive layer 141 and the second transparent conductive layer 145. The positive ions stored in the ion storage layer 142 enter the electrochromic layer 144 through the ion conductor layer 143 under the action of the electric field. As a result, the electrochromic layer 144 is switched from a first state in which the electrochromic layer 144 is substantially transparent to a second state in which the electrochromic layer 144 is substantially opaque. When a reverse voltage (i.e. a negative voltage) is applied between the first transparent conductive layer 141 and the second conductive layer 145, the potential on the first transparent conductive layer 141 is lower than that on the second transparent conductive layer 145, that is, an electric field in the opposite direction of the X direction is formed between the first transparent conductive layer 141 and the second transparent conductive layers 145. The positive ions are extracted from the electrochromic layer 144 and returned to the ion storage layer 142 through the ion conductive layer 143 under the action of the electric field. As a result, the electrochromic layer 144 is switched from the second state in which the electrochromic layer 144 is substantially opaque to the first state in which the electrochromic layer 144 is substantially transparent.

Specifically, for example, the ions stored in the ion storage layer 142 are negative ions. When a negative voltage is applied between the first transparent conductive layer 141 and the second transparent conductive layer 145, the potential on the first transparent conductive layer 141 is lower than that on the second transparent conductive layer 145, that is, an electric field in the opposite direction of the X direction is formed between the first transparent conductive layer 141 and the second transparent conductive layer 145. The negative ions stored in the ion storage layer 142 enter the electrochromic layer 144 through the ion conductor layer 143 under the action of the electric field. As a result, the electrochromic layer 144 is switched from a first state in which the electrochromic layer 144 is substantially transparent to a second state in which the electrochromic layer 144 is substantially opaque. When a reverse voltage (i.e., a positive voltage) is applied between the first transparent conductive layer 141 and the second conductive layer 145, the potential on the first transparent conductive layer 141 is higher than that on the second transparent conductive layer 145, that is, an electric field in the X direction is formed between the first transparent conductive layer 141 and the second transparent conductive layer 145. The negative ions are extracted from the electrochromic layer 144 and returned to the ion storage layer 142 through the ion conductive layer 143 under the action of the electric field. As a result, the electrochromic layer 144 is switched from the second state in which the electrochromic layer 144 is substantially opaque to the first state in which the electrochromic layer 144 is substantially transparent.

When the electrochromic layer 144 is in the first state in which the electrochromic layer 144 is substantially transparent, the electrochromic device 14 has a first transmittance as a whole, and when the electrochromic layer 144 is in the second state in which the electrochromic layer 144 is substantially opaque, the entire electrochromic device 14 has a second transmittance as a whole.

In some embodiments, when a voltage is applied between the first transparent conductive layer 141 and the second transparent conductive layer 145, the electrochromic layer 144 is switched from the first state in which the electrochromic layer 144 is substantially transparent, to the second state in which the electrochromic layer 144 is substantially opaque. When the voltage applied between the first transparent conductive layer 141 and the second transparent conductive layer 145 is stopped, the electrochromic layer 144 is restored from the second state in which the electrochromic layer 144 is substantially opaque, to the first state in which the electrochromic layer 144 is substantially transparent.

In some embodiments, the voltage applied between the first transparent conductive layer 141 and the second transparent conductive layer 145 may be introduced by the backplane circuit assembly 12.

Figure 6:
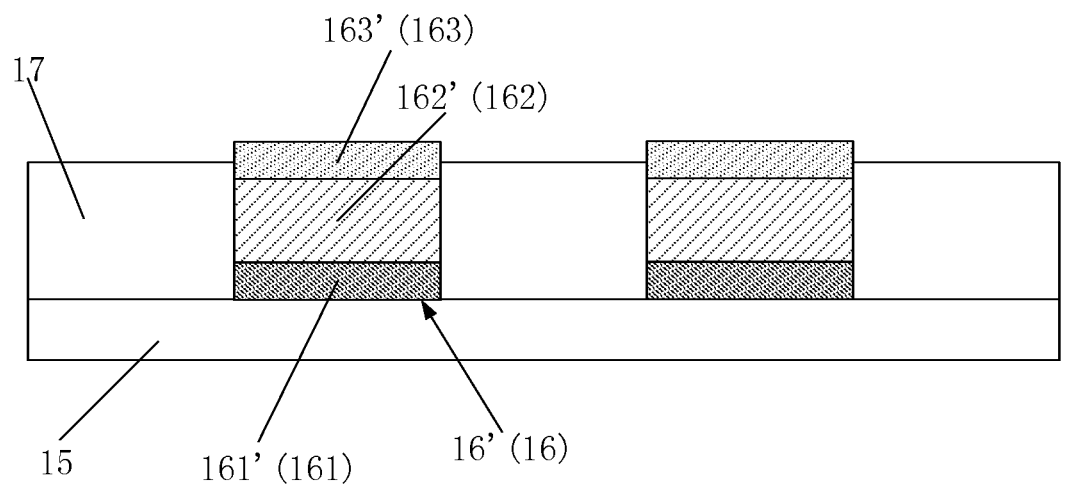
FIG. 6 is an enlarged schematic view of a region C in FIG. 2.
Figure 7:
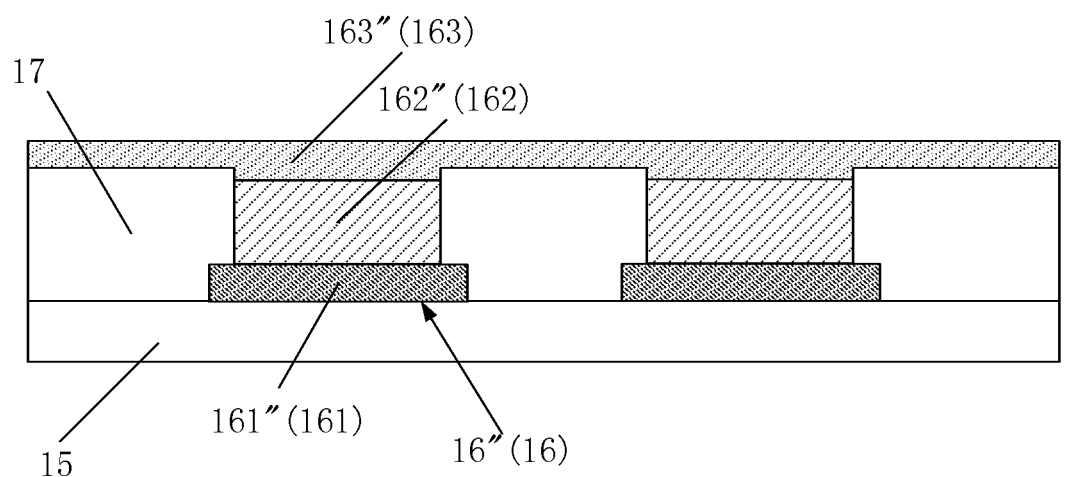
FIG. 7 is an enlarged schematic view of a region D in FIG. 2.

FIG. 6 is an enlarged schematic view of a region C in FIG. 2, and FIG. 7 is an enlarged schematic diagram of a region D in FIG. 2. As shown in FIGS. 6 and 7, each of the electroluminescent devices 16 in both the first display area AA1 and the second display area AA2 has a multilayer structure. Combined with FIG. 2, each electroluminescent device 16 includes a first electrode 161, an electroluminescent layer 162, and a second electrode 163 which are sequentially disposed away from the substrate 11 and are stacked on each other. Taking the electroluminescent device 16 as an OLED device as an example, the first electrode 161 is, for example, an anode, which may be made of an opaque metal material, or may be made of a transparent conductive material, such as ITO, ZnO, or the like. In some embodiments, the anode is made of a metal material. Since the metal material has good conductive properties, precise control of the voltage applied to the anode may be achieved, so that the electroluminescent device 16 may exhibit a good display effect. The electroluminescent layer 162 is, for example, an organic light emitting layer, which may include a hole injection layer (HIL), a hole transport layer (HTL), an electron blocking layer (EBL), a light emitting layer (EML), and a hole blocking layer (HBL), an electron transport layer (ETL), and an electron injection layer (EIL). The electroluminescent layer 162 may emit light, such as red, green, or blue monochromatic light, when a voltage is applied. The second electrode 163 is, for example, a cathode, and is usually made of a transparent conductive material, such as ITO, ZnO, or the like.

For convenience of description, the electroluminescent devices 16 located in the first display area AA1 may be referred to as first electroluminescent devices 16', and the electroluminescent devices 16 located in the second display area AA2 may be referred to as second electroluminescent devices 16". For example, each of the first electroluminescent devices 16' and the second electroluminescent devices 16" may be an OLED device including a cathode, an organic light emitting layer, and an anode. Hereinafter, the embodiments of the present disclosure are further described in detail by taking OLED devices as an example, for example, each first electroluminescent device 16' is a first OLED device 16' including a first anode, a first organic light emitting layer, and a first cathode, and each second electroluminescent device 16" is a second OLED device 16" including a second anode, a second organic light emitting layer and a second cathode.

As shown in FIG. 6 and FIG. 7, in the first display area AA1, the first OLED device 16' includes a first anode 161', a first organic light emitting layer 162', and a first cathode 163' which are arranged away from the substrate and are stacked on each other. In the second display area AA2, the second OLED device 16" includes a second anode 161", a second organic light emitting layer 162", and a second cathode 163" which are arranged away from the substrate and are stacked on each other. For example, the first OLED device 16' and the second OLED device 16" may be OLED devices emitting the same color (for example, one of red, green, or blue).

FIG. 8 is a schematic view of a pixel arrangement of a display device according to some embodiments of the present disclosure. As shown in FIG. 8, red pixels R, green pixels G, and blue pixels B are arranged in an array. Each of red pixels R, green pixels G, and blue pixels B includes an electroluminescent device 16, and an area occupied by each pixel is substantially equal to an area of the first electrode 161 of the corresponding electroluminescent device 16. Since the anode is usually made of a metal material that does not transmit light, an area where each pixel is located usually does not allow external light to pass through. An area between each pixel is provided with a transparent pixel defining layer 17 which allows external light to pass through.

In some embodiments, a ratio of a total area of the first anodes 161' of all the first OLED devices 16' in the first display area AA1 to an area of the first display area AA1 is smaller than a ratio of a total area of the second anodes 161" of all the second OLED devices 16" in the second display area AA2 to an area of the second display area AA2. For example, the ratio of the total area of the first anodes 161' of all the first OLED devices 16' in the first display area AA1 to the area of the first display area AA1 may be in a range of 20% to 30%, for example, about 25%; the ratio of the total area of the second anodes 161" of all the second OLED devices 16" in the second display area AA2 to the area of the second display area AA2 may be in a range of 30% to 40%, for example, about 35%.

Specifically, referring to FIGS. 6, 7 and 8, an area of an orthographic projection of a first anode 161' of a single first OLED device 16' on the substrate 11 is smaller than an area of an orthographic projection of a second anode 161" of a single second OLED device 16" on the substrate 11, the single first OLED device 16' having the same color as the single second OLED device 16". That is, a size of the first anode 161' of the single first OLED device 16' is smaller than a size of the second anode 161" of the single second OLED device 16". When the first anode electrode 161' and the second anode electrode 161" are made of an opaque metal material, and when the distribution density of the OLED devices 16 in the first display area AA1 is the same as that in the second display area AA, the first display area AA1 per unit area allows more light to be transmitted than the second display area AA2 per unit area. At this time, the ratio of the total area of the first anodes 161 'of all the first OLED devices 16' in first display area AA1 to the area of the first display area AA1 is smaller than the ratio of the total area of the second anodes 161" of all the second OLED devices 16" in the second display area AA2 to the area of the second display area AA2, which is beneficial to the image acquisition of the image acquisition device 20 corresponding to the display area AA1.

Optionally, the density of the first OLED devices 16' in the first display area AA1 may be smaller than the density of the second OLED devices 16" in the second display area AA2, so that the ratio of the total area of the first anodes 161 'of all the first OLED devices 16' in first display area AA1 to the area of the first display area AA1 is smaller than the ratio of the total area of the second anodes 161" of all the second OLED devices 16" in the second display area AA2 to the area of the second display area AA2, which is also beneficial to the image acquisition of the image acquisition device 20 corresponding to the display area AA1.

In some embodiments, as shown in FIG. 7, in the second display area AA2, second cathodes 163" of at least two adjacent second OLED devices 16" are connected to each other as a whole, for example, all of the second cathodes 163" of the second OLED devices 16" in the second display area AA2 are integrally formed, thereby simplifying the manufacturing process. As shown in FIG. 6, in the first display area AA1, first cathodes 163' of the first OLED devices 16' are spaced apart from each other. Although the cathodes are usually made of a transparent conductive material, there is still a certain amount of light loss when light passes through the transparent conductive material. In the embodiments, the first cathodes 163 'of the first OLED devices 16' are spaced from each other, and the first cathodes 163' does not shield the pixel defining layer 17 between adjacent first OLED devices 16', so that the first display area AA1 may allow as much light as possible to pass through, which is beneficial to the image acquisition of the image acquisition device 20 corresponding to the first display area AA1.

In some embodiments, in order to further increase the light transmittance of the first display area AA1 of the display panel 10, the first anodes 161' of the first OLED devices 16' in the first display area AA1 may also be made of a transparent conductive material, such as ITO, ZnO, and the like.

For example, the display device according to the embodiments of the present disclosure may be any product or component having a display function and a camera function, such as a television, a display, a digital photo frame, a mobile phone, a smart watch, a tablet computer, and the like.

Some embodiments of the present disclosure also provide a method for controlling the above display device. FIG. 9 shows a flowchart of a method for controlling the display device according to some embodiments of the present disclosure. As shown in FIG. 9, the method includes the following steps:

S10: controlling the first display area to be in a non-display state and switching the device with variable transmittance to a first transmittance in response to the image acquisition device being in an operating state; and S20: controlling the first display area to be in a display state and switching the device with variable transmittance to a second transmittance in response to the image acquisition device being in a non-operating state.

In step S10, referring to FIG. 2, the electroluminescent devices 16 (e.g. the first OLED devices 16') in the first display area AA1 of the display panel 10 do not emit light, that is, the first display area AA1 is in a non-display state. The device with variable transmittance 14, (e.g. an electrochromic device) is switched to the first transmittance, that is, the device with variable transmittance is substantially transparent. At this time, external light may pass through the pixel defining layer 17, the second planarization layer 15, the device with variable transmittance 14, the first planarization layer 13, and the backplane circuit assembly 12 and the substrate 11 between the electroluminescent devices 16 in the first display area AA1, and then be incident on the image acquisition device 20 to complete the image acquisition. In this case, since the first display area AA1 works in the non-display state, it may be avoided as much as possible that the electroluminescent devices 16 in the first display area AA1 emits light and affects light for image acquisition. Since the device with variable transmittance 14 is switched to the first transmittance, as much external light as possible passes through the first display area AA1 of the display panel 10 and reaches the image acquisition device 20 to obtain a better image acquisition effect. In addition, in the above case, the second display area AA2 of the display panel 10 may be normally displayed, for example, an image obtained by the image acquisition device 20 is displayed.

In step S20, referring to FIG. 3, the electroluminescent device 16 (e.g. the first OLED device 16') in the first display area AA1 of 10 in the display panel may emit light, that is, the first display area AA1 is in a display state. The device with variable transmittance 14 (e.g., an electrochromic device) is switched to the second transmittance, that is, the device with variable transmittance is substantially opaque. At this time, both the first display area AA1 and the second display area AA2 may work in the display state, thereby achieving an ultra-high screen ratio of the display device. In this case, the device with variable transmittance 14 is basically in an opaque state, it may minimize the light reflected by components (e.g. the image acquisition device 20, the backplane circuit assembly and the like) located on the side of the transmittance variable device 14 away from the electroluminescent devices 16 toward the electroluminescent devices 16, thereby avoiding affecting the normal display of the first display area AA1.

In some embodiments, the device with variable transmittance 14 is, for example, an electrochromic device. As shown in FIG. 5, the electrochromic device 14 includes a first transparent conductive layer 141, an ion storage layer 142, and an ion conductor layer 143, an electrochromic layer 144, and a second transparent conductive layer 145 which are sequentially stacked. At this time, the above step S10 includes the following steps:

S11: applying a first voltage between the first transparent electrode layer and the second transparent electrode layer, so that the electrochromic device is switched to the first transmittance.

In step S11, the first voltage may be a positive voltage or a negative voltage. When the first voltage is a positive voltage, the potential on the first transparent conductive layer 141 is higher than the potential on the second transparent conductive layer 145. When a voltage is a negative voltage, the potential on the first transparent conductive layer 141 is lower than the potential on the second transparent conductive layer 145. The positive voltage or negative voltage may be selected according to the electrical properties of the ions in the ion storage layer 142.

In some embodiments, the first voltage may be 0, that is, when the voltage applied between the first transparent conductive layer 141 and the second transparent conductive layer 145 returns to 0, the electrochromic layer 144 returns to a substantially transparent state.

The above step S20 includes the following steps:

S21: applying a second voltage between the first transparent electrode layer and the second transparent electrode layer, so that the electrochromic device is switched to a second transmittance.

In step S21, the second voltage may be a positive voltage or a negative voltage. When the second voltage is a positive voltage, the potential on the first transparent conductive layer 141 is higher than the potential on the second transparent conductive layer 145. When the first voltage is a negative voltage, the potential on the first transparent conductive layer 141 is lower than the potential on the second transparent conductive layer 145. The positive voltage or negative voltage may be selected according to the electrical properties of the ions of the ion storage layer 142.

In some embodiments, the first voltage and the second voltage are reverse voltages. Although the present disclosure has been described with reference to the accompanying drawings, the embodiments disclosed in the drawings are intended to exemplify the embodiments of the present disclosure, and should not be construed as a limitation to the present disclosure. The dimensional ratios in the drawings are only schematic and should not be construed as limiting the present disclosure.

The above embodiments only exemplarily illustrate the principle and structure of the present disclosure and are not intended to limit the present disclosure. Those skilled in the art should understand that any changes and improvements made to the present disclosure are within the scope of the disclosure without departing from the general concept of the disclosure. The protection scope of this disclosure shall be a scope defined by the claims of this application.

What is claimed is:

1. A display device, comprising:
a transparent substrate;
a plurality of electroluminescent devices arranged in an array on the substrate, the plurality of electroluminescent devices being located in a display area of the display device, the display area comprising a first display area and a second display area;
a device with variable transmittance located at least in the first display area and located between the electroluminescent devices and the substrate, wherein the device with variable transmittance is configured so that a transmittance of the device with variable transmittance is switchable between a first transmittance and a second transmittance, the first transmittance is greater than the second transmittance; and
an image acquisition device on a side of the substrate away from the electroluminescent devices, an orthographic projection of the image acquisition device on the substrate falling within an orthographic projection of the first display area on the substrate,
wherein, in a case where the transmittance of the device with variable transmittance is switched to the first transmittance, external light irradiating the display device can pass through the device with variable transmittance and be incident on the image acquisition device;

wherein, the orthographic projection of the image acquisition device on the substrate falls within an orthographic projection of the device with variable transmittance on the substrate.

2. The display device according to claim 1, wherein, in a case where the transmittance of the device with variable transmittance is switched to the second transmittance, the device with variable transmittance blocks reflected light from being incident on the electroluminescent devices in the first display area, the reflected light comprising at least light reflected by the image acquisition device.

3. The display device according to claim 1, wherein the orthographic projection of the image acquisition device on the substrate falls within an orthographic projection of the device with variable transmittance on the substrate.

4. The display device according to claim 1, wherein an orthographic projection of the device with variable transmittance on the substrate falls within the orthographic projection of the first display area on the substrate.

5. The display device according to claim 1, wherein the device with variable transmittance is configured to switch the transmittance of the device with variable transmittance to the first transmittance in response to the image acquisition device being in an operating state;
and to switch the device with variable transmittance to the second transmittance in response to the image acquisition device being in a non-operating state.

6. The display device according to claim 1, wherein the device with variable transmittance comprises an electrochromic device, the electrochromic device comprising a first transparent conductive layer, an ion storage layer, an ion conductor layer, an electrochromic layer, and a second transparent conductive layer which are sequentially stacked.

7. The display device according to claim 1, further comprising:
a backplane circuit assembly between the device with variable transmittance and the substrate.

8. The display device according to claim 7, wherein each of the electroluminescent devices comprises a first electrode, an electroluminescent layer, and a second electrode which are sequentially disposed away from the substrate, the backplane circuit assembly comprises a driving transistor, and the first electrode is electrically connected to the driving transistor through a via hole penetrating the device with variable transmittance.

9. The display device according to claim 7, further comprising:
a first planarization layer between the backplane circuit assembly and the device with variable transmittance; and/or
a second planarization layer between the electroluminescent devices and the device with variable transmittance.

10. The display device according to claim 1, wherein the plurality of electroluminescent devices comprise a plurality of first electroluminescent devices located in the first display area and a plurality of second electroluminescent devices located in the second display area, and each of the plurality of first electroluminescent devices and the plurality of second electroluminescent devices comprises a first electrode, an electroluminescent layer and a second electrode which are sequentially disposed away from the substrate,
a ratio of a total area of first electrodes of the plurality of first electroluminescent devices to an area of the first display area is smaller than a ratio of a total area of first electrodes of the plurality of second electroluminescent devices to an area of the second display area.

11. The display device according to claim 10, wherein second electrodes of the plurality of first electroluminescent devices are spaced apart from each other.

12. The display device according to claim 11, wherein second electrodes of the plurality of second electroluminescent devices constitute a continuous integrated structure.

13. The display device according to claim 10, wherein first electrodes of the plurality of first electroluminescent devices are made of a transparent conductive material.

14. The display device according to claim 10, wherein the first electrode is an anode and the second electrode is a cathode.

15. The display device according to claim 1, wherein the first transmittance is greater than or equal to 90%, and/or the second transmittance is less than or equal to 10%.

16. A display panel, comprising:
a transparent substrate;
a plurality of electroluminescent devices arranged in an array on the substrate, the plurality of electroluminescent devices being located in a display area of the display panel, the display area comprising a first display area and a second display area; and
a device with variable transmittance located at least in the first display area and located between the electroluminescent devices and the substrate, wherein the device with variable transmittance is configured so that a transmittance of the device with variable transmittance is switchable between a first transmittance and a second transmittance, the first transmittance is greater than the second transmittance,
wherein, in a case where the transmittance of the device with variable transmittance is switched to the first transmittance, external light irradiating the display panel can pass through the device with variable transmittance;
wherein, the orthographic projection of the image acquisition device on the substrate falls within an orthographic projection of the device with variable transmittance on the substrate.

* * * * *